United States Patent
Wu et al.

(10) Patent No.: US 9,806,260 B2
(45) Date of Patent: Oct. 31, 2017

(54) ORGANIC LIGHT-EMITTING DIODE DISPLAY DEVICE, MANUFACTURING METHOD THEREOF, AND DISPLAY APPARATUS

(71) Applicants: BOE TECHNOLOGY GROUP CO., LTD, Beijing (CN); ORDOS YUANSHENG OPTOELECTRONICS CO., LTD., Ordos (CN)

(72) Inventors: Haidong Wu, Beijing (CN); Xiang Feng, Beijing (CN); Zhiliang Jiang, Beijing (CN); Xiaojin Zhang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 15/031,251
(22) PCT Filed: Sep. 18, 2015
(86) PCT No.: PCT/CN2015/089925
§ 371 (c)(1),
(2) Date: Apr. 21, 2016
(87) PCT Pub. No.: WO2016/134595
PCT Pub. Date: Sep. 1, 2016

(65) Prior Publication Data
US 2016/0372671 A1 Dec. 22, 2016

(30) Foreign Application Priority Data
Feb. 25, 2015 (CN) .......................... 2015 1 0087042

(51) Int. Cl.
*H01L 51/00* (2006.01)
*H01L 51/50* (2006.01)
*H01L 51/52* (2006.01)

(52) U.S. Cl.
CPC ...... *H01L 51/0021* (2013.01); *H01L 51/0045* (2013.01); *H01L 51/5064* (2013.01);
(Continued)

(58) Field of Classification Search
CPC ............. H01L 51/0021; H01L 51/0045; H01L 51/5064; H01L 51/5056; H01L 51/5088; H01L 51/5206; H01L 2251/305
See application file for complete search history.

(56) References Cited

U.S. PATENT DOCUMENTS

| 2013/0092238 A1* | 4/2013 | Ogata | H01L 31/0256 |
| | | | 136/263 |
| 2014/0145145 A1* | 5/2014 | Lee | H01L 51/5012 |
| | | | 257/13 |
| 2014/0352784 A1* | 12/2014 | Kim | H01L 31/055 |
| | | | 136/257 |

FOREIGN PATENT DOCUMENTS

| CN | 102583354 A | 7/2012 |
| CN | 103345979 A | 10/2013 |

(Continued)

OTHER PUBLICATIONS

The State Intellectual Property Office of the People's Republic of China (SIPO) Office Action 1 for 201510087042.8, dated Jun. 1, 2016, p. 1-8.

(Continued)

*Primary Examiner* — Karen Kusumakar
(74) *Attorney, Agent, or Firm* — Anova Law Group, PLLC

(57) ABSTRACT

The present disclosure provides an organic light-emitting diode (OLED) display device, a manufacturing method thereof, and a display apparatus containing the OLED display device. A pattern of an anode layer is formed over a base substrate. A graphene oxide layer is formed over the pattern of the anode layer by an electroplating process. The graphene oxide layer is used as an auxiliary layer or is used as at least one of a hole injection layer and a hole transport layer in the OLED display device. Since the graphene oxide material has high work function, the hole injection barrier may be reduced and to the hole injection and hole transport capability of the OLED display device may be enhanced to improve light emitting performance of the OLED display device.

20 Claims, 3 Drawing Sheets

(52) U.S. Cl.
CPC ...... *H01L 51/5056* (2013.01); *H01L 51/5088* (2013.01); *H01L 51/5206* (2013.01); *H01L 2251/305* (2013.01)

(56) References Cited

FOREIGN PATENT DOCUMENTS

| | | | |
|---|---|---|---|
| CN | 103824975 | * | 5/2014 |
| CN | 103824975 A | | 5/2014 |
| CN | 104183374 A | | 12/2014 |
| CN | 104183735 A | | 12/2014 |
| CN | 102583354 | * | 5/2015 |
| CN | 104617235 A | | 5/2015 |
| KR | 20130078043 A | | 7/2013 |
| KR | 20140019642 A | | 2/2014 |
| WO | 2011141717 A | | 11/2011 |

OTHER PUBLICATIONS

The World Intellectual Property Organization (WIPO) International Search Report for PCT/CN2015/089925, dated Dec. 11, 2015, p. 1-5.

* cited by examiner

ORGANIC LIGHT-EMITTING DIODE DISPLAY DEVICE, MANUFACTURING METHOD THEREOF, AND DISPLAY APPARATUS

CROSS-REFERENCES TO RELATED APPLICATIONS

This application is a national phase entry under 35 U.S.C. §371 of International Application No. PCT/CN2015/089925, filed on Sep. 18, 2015, which claims priority to Chinese Patent Application No. 201510087042.8, filed on Feb. 25, 2015. The above enumerated patent applications are incorporated by reference herein in their entirety.

FIELD OF THE DISCLOSURE

The present disclosure generally relates to the field of display technology and, more particularly, relates to an organic light-emitting diode (OLED) display device, a method of manufacturing the OLED display device, and a display apparatus containing the OLED display device.

BACKGROUND

Nowadays, organic light-emitting diode (OLED) display devices are widely used in the display field. OLED display devices may provide excellent characteristics including a low power consumption level, a high color saturation level, a wide viewing angle, and a thin dimension. The OLED display devices may be used as flexible display.

Generally, an OLED display device includes a base substrate. The OLED display device also includes an anode layer, a hole injection layer, a hole transport layer, a light emitting layer, an electron transport layer, an electron injection layer and a cathode layer, which are laminated sequentially on the base substrate. When a voltage is applied between the anode layer and the cathode layer, a current is formed there-between. The electrons in the cathode layer are transported through the electron injection layer and the electron transport layer. And the holes in the anode layer are transported through the hole injection layer and the hole transport layer. When the electrons and the holes are combined at the light emitting layer to form electron-hole pairs, the light emitting substances are excited in the light emitting layer to emit light.

Among all the materials, ITO (Indium Tin Oxide) has stable chemical properties and high conductivity and has been widely used in the anode layer of the OLED display device. However, the ITO material has low work function of about 4.5 eV-4.8 eV. Although the work function of the ITO material may be increased by physical treatments of oxygen plasma, ultraviolet (UV) radiation under ozone environment, etc., it is difficult to increase the work function of the ITO to reach 5.0 eV, which is still below the HOMO (Highest Occupied Molecular Orbital) of most of the hole injection layers and hole transport layers. Due to the low work function of the ITO material, the hole injection and hole transport capability are significantly reduced. This adversely affects the light emitting performance of the OLED display device.

Therefore, it is desirable to lower the hole injection barrier and to enhance the injection and transport capability of the holes in an OLED display device. The present disclosure is directed to solve one or more problems set forth above.

BRIEF SUMMARY OF THE DISCLOSURE

One aspect of the present disclosure provides a method of manufacturing an organic light-emitting diode (OLED) display device. A pattern of an anode layer is formed over a base substrate. A graphene oxide layer is formed over the pattern of the anode layer by an electroplating process.

Optionally, a hole injection layer is formed over the anode layer, a hole transport layer is formed over the hole injection layer, and a light-emitting layer is formed over the hole transport layer.

Optionally, the graphene oxide layer is formed between the hole injection layer and the hole transport layer and in contact with each of the hole injection layer and the hole transport layer, and/or the graphene oxide layer is formed between the hole transport layer and the light-emitting layer and in contact with each of the hole transport layer and the light-emitting layer.

Optionally, the graphene oxide layer is used as at least one of a hole injection layer and a hole transport layer of the OLED display device.

Optionally, the graphene oxide layer is formed on the anode layer and used as the hole injection layer, and the hole transport layer is formed on and in contact with the graphene oxide layer.

Optionally, the graphene oxide layer is used as the hole transport layer, the hole injection layer is formed on the anode layer, and the graphene oxide layer is formed on and in contact with the hole injection layer.

Optionally, the graphene oxide layer is used as a combination of the hole injection layer and the hole transport layer of the OLED display device. The graphene oxide layer is formed on and in contact with the anode layer, and a light-emitting layer of the OLED display device is formed on and in contact with the graphene oxide layer.

Optionally, to form the graphene oxide layer over the pattern of the anode layer by the electroplating process, the base substrate having the pattern of the anode layer and a cathode are placed into a graphene oxide electroplating solution. A voltage is applied between the cathode and the anode layer on the base substrate to deposit the graphene oxide layer over the pattern of the anode layer.

Optionally, the base substrate further includes a hole injection layer on the anode layer, and the graphene oxide layer is directly formed on the hole injection layer.

Optionally, the base substrate further includes a hole transport layer on a hole injection layer that is on the anode layer, and the graphene oxide layer is directly formed on the hole transport layer.

Optionally, a thickness of the graphene oxide layer is controlled during the electroplating process by controlling an electroplating time, an electroplating voltage, and a concentration of the graphene oxide electroplating solution.

Optionally, a thickness of about 1 nm to about 20 nm is controlled for the graphene oxide layer during the electroplating process by controlling an electroplating time ranging from about 1 second to about 1000 seconds, an electroplating voltage ranging from about 1 volt to about 20 volts, and a concentration of the graphene oxide electroplating solution ranging from about 0.1 mg/mL to about 100 mg/mL.

Optionally, a thickness of about 50 nm or less is controlled for the graphene oxide layer during the electroplating process by controlling an electroplating time of about 3 minutes, an electroplating voltage of about 5 volts, and a concentration of the graphene oxide electroplating solution of about 2 mg/mL.

Optionally, a thickness of about 100 nm or less is controlled for the graphene oxide layer during the electroplating process by controlling an electroplating time of about 6 minutes, an electroplating voltage of about 5 volts, and a concentration of the graphene oxide electroplating solution of about 2.5 mg/mL.

Optionally, the graphene oxide electroplating solution includes a blend solvent including an inorganic solvent and an alcoholic organic solvent.

Optionally, the alcoholic organic solvent includes a methanol, ethanol, isopropanol, or a combination thereof; and the inorganic solvent includes deionized water. Optionally, the graphene oxide electroplating solution further contains poly (3,4-ethylenedioxythiophene) and polystyrene sulfonate (PEDOT:PSS).

Optionally, when the OLED display device has a top emission structure, the anode layer is made of ITO/Ag/ITO. Optionally, when the OLED display device has a bottom emission structure, the anode layer is made of ITO.

Optionally, the graphene oxide layer is treated by an oxygen plasma or a ultraviolet (UV) radiation in ozone environment.

Another aspect of the present disclosure provides an organic light-emitting diode (OLED) display device formed according to the disclosed methods.

Another aspect of the present disclosure provides a display apparatus including the disclosed OLED display device.

Other aspects of the present disclosure can be understood by those skilled in the art in light of the description, the claims, and the drawings of the present disclosure.

DETAILED DESCRIPTION

Figure 1:
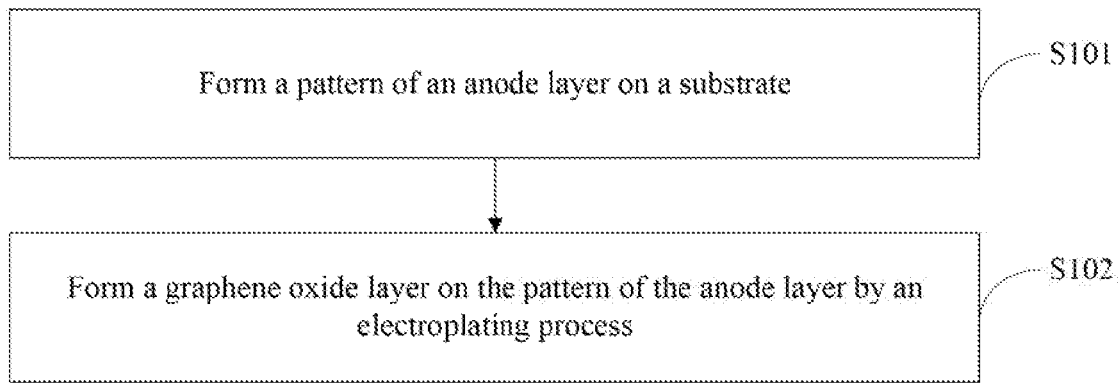
FIG. 1 illustrates a flow chart of an exemplary method of manufacturing an OLED display device according to various embodiments of the present disclosure.

In order for those skilled in the art to better understand the technical solutions of the present disclosure, the followings together with accompanying drawings describe in detail the present disclosure with specific embodiments. It is to be noted that the thickness and the shape of each film layer illustrated in the drawings may not necessarily reflect the true dimensional proportion of the OLED display device, and are only used for schematic illustration purposes.

The present disclosure provides an OLED display device, a manufacturing method thereof and a related display apparatus. According to the present disclosure, the hole injection barrier, and the hole injection and the hole transport capability of the OLED display device are enhanced. Therefore, the light emitting performance of the OLED display device is improved.

As disclosed, a graphene oxide layer may be used as an auxiliary layer or a functional layer in an OLED display device due to the excellent properties including, for example, high work function, superior conductivity, excellent hole transport capability, etc. of graphene oxide material. The auxiliary and/or functional layer made by the graphene oxide material may lower the hole injection voltage barrier and enhance the hole-injection and hole-transport capability of the resultant OLED display device.

In one embodiment, a graphene oxide layer may be used as an auxiliary layer in an OLED display device. For example, the OLED display device may include a hole injection layer formed over an anode layer, and a hole transport layer formed over the hole injection layer, and a light-emitting layer over the hole transport layer. The graphene oxide layer may be formed between the anode layer and the hole injection layer, between the hole injection layer and the hole transport layer, and/or between the hole transport layer and the light-emitting layer. In one embodiment, the graphene oxide layer may be formed between those layers, including the anode layer, the hole injection layer, the hole transport layer, and the light-emitting layer, in a manner to be in direct contact with adjacent any layer.

In another embodiment, a graphene oxide layer may be used as a functional layer in an OLED display device. For example, the graphene oxide layer may be used as at least one of a hole injection layer and a hole transport layer of the OLED display device. In this case, the graphene oxide layer may be formed on and in contact with the anode layer and used as the hole injection layer, while the hole transport layer may be formed on and in contact with the graphene oxide layer. Alternatively, the graphene oxide layer may be used as the hole transport layer, while the hole injection layer is formed on the anode layer, and the graphene oxide layer is formed on and in contact with the hole injection layer. In other cases, the graphene oxide layer may be used as or may be used to replace a combination of the hole injection layer the hole transport layer, and the graphene oxide layer may be formed on and in contact with the anode layer, while the light-emitting layer may be formed on and in contact with the graphene oxide layer.

In another embodiment, one or more graphene oxide layers may be formed in an OLED display device. For example, graphene oxide layers may be used as functional layer(s) and/or auxiliary layer(s) in a single OLED display device.

FIG. 1 illustrates a schematic flow chart of an exemplary method for manufacturing an OLED display device. For illustration purposes, FIG. 1 merely shows that a graphene oxide layer is formed on a base substrate having an anode layer thereon, while the present disclosure may encompass forming the graphene oxide layer on any suitable layer over the base substrate.

In S101, a patterned anode layer, i.e., a pattern of an anode layer, is formed on a base substrate. In S102, a graphene oxide layer is formed on the patterned anode layer, for example, by an electroplating process.

The graphene oxide layer formed by the electroplating process over the surface of the anode layer may provide desired quality for forming OLED display devices. The graphene oxide layer may be a patterned graphene oxide layer according to the pattern of the anode layer over the base substrate. Based on the high work function of the graphene oxide material, which is around 4.7 eV, the graphene oxide layer may be used as an auxiliary function layer or a functional layer in the disclosed OLED display devices. For example, the energy level at the interface of the patterned anode layer and hole injection barrier may be better matched. Thus, the hole-injection and hole-transport capability of the OLED display device are enhanced, improving the light emitting efficiency of the OLED display devices.

A variety of methods may be used to produce the graphene oxide layer including, for example, spin-coating, film material dripping, magnetron sputtering, electroplating, and the like. However, the spin-coating method and the film material dripping method have the drawbacks on film thickness controlling, and thus may not be used for large surfaces. Specifically, voids may be formed in the prepared film. In addition, the spin-coating method and the film material dripping method may also result in waste of raw materials.

Other methods such as the magnetron sputtering method may require high production cost and high energy-consuming. In the case when the energy is poorly controlled, the magnetron sputtering method may result in surface detriment of the anode layer. Therefore, the disclosed manufacturing method chooses the electroplating process to produce the pattern of the graphene oxide layer.

Compared with the spin-coating method, the film material dripping method, and the magnetron sputtering method, the electroplating method is easy to be applied in a large surface. The electroplating method also has the advantages of saving raw materials and with a shortened production time, which makes it suitable to be integrated in a mass production line. Further, the electroplating method may form the graphene oxide layer only on the pattern of the anode layer, without using a conventional photomask or a conventional photolithographic process for forming patterns of the graphene oxide layer.

Referring back to S102 for forming the pattern of the graphene oxide layer over the pattern of the anode layer, the base substrate having the patterned anode layer thereon, along with a cathode may be placed into a plating bath tank containing graphene oxide plating solution. A voltage with a pre-set value is applied between the cathode and anode. After a pre-set time of electroplating process, the pattern of the graphene oxide layer may be formed on the patterned anode layer. Accordingly, the graphene oxide layer and the anode layer, over the base substrate, may have the same pattern.

Figure 2A:
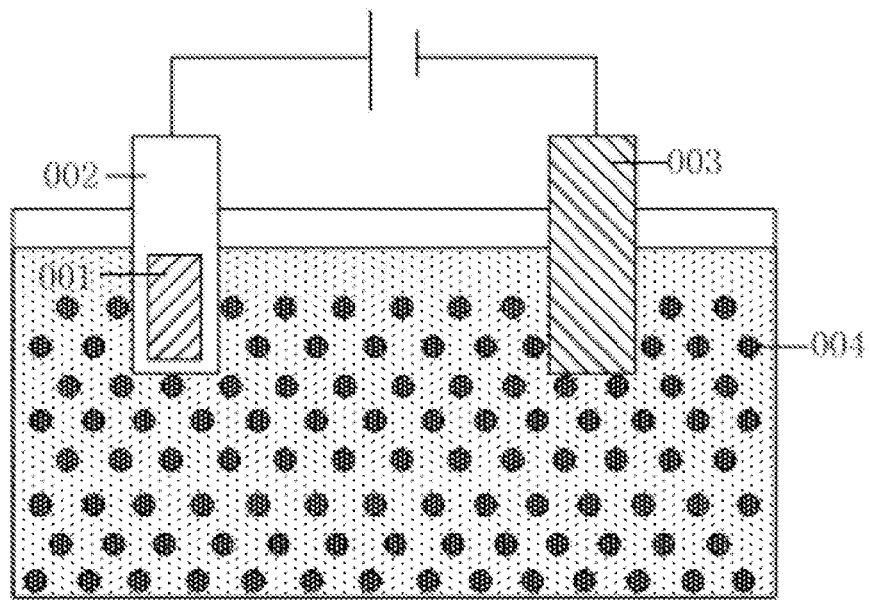
FIG. 2a illustrates an exemplary method for forming an OLED display device according to various embodiments of the present disclosure.

Note that the patterned anode layer may be used as an anode layer of the OLED display device, as shown in FIGS. 3a-3d and may also be used as the anode layer in the electroplating process as shown in FIG. 2a.

In one embodiment, as shown in FIG. 2a, the base substrate 002 having the pattern of the anode layer 001 formed there-over and the cathode 003 are placed into the plating bath tank which contains the graphene oxide electroplating solution. The black dots illustrated in FIG. 2a represent the graphene oxide molecules 004. The anode layer 001 of the OLED display device can also be used as an anode for the electroplating process. And the material of the cathode 003 can be any electrical conductive material, such as copper, aluminum, iron, etc. The selection of those materials is not limited in the present disclosure.

Figure 2B:
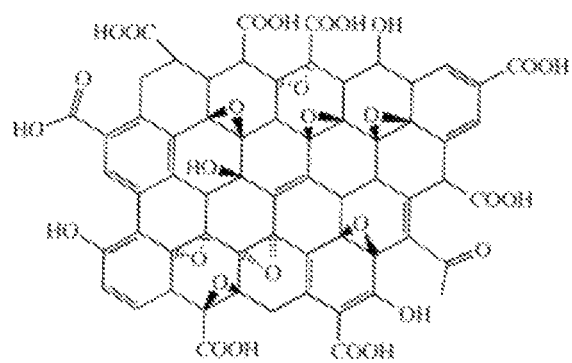
FIG. 2b illustrates a schematic molecular structure diagram of graphene oxide according to various embodiments of the present disclosure.

After the voltage with the pre-set value is applied between the cathode 003 and the anode 001, the graphene oxide molecules 004 in the electroplating solution will be negatively charged due to the oxygen-containing groups, such as the hydroxyl groups, the carboxyl groups and/or the carbonyl groups, on the surface of the graphene oxide molecules 004, as shown in FIG. 2b. Therefore, the graphene oxide molecules 004 will be adsorbed and then deposited on the surface of the anode layer 001 during the electroplating process to form the pattern of the graphene oxide layer over the pattern of the anode layer 001.

During the electroplating process for forming the pattern of the graphene oxide layer over the pattern of the anode layer, various electroplating parameters may be controlled and adjusted. For example, the electroplating time and the electroplating voltage can be adjusted to control the thickness of the graphene oxide layer formed over the surface of the anode layer depending on. For example, the thickness of graphene oxide layer may be increased by increasing the electroplating time, the electroplating voltage, and/or the concentration of the graphene oxide in the plating bath tank.

In an exemplary embodiment, the electroplating time may be set for about 1 second to about 1000 second, the electroplating voltage may be set for about 1 V to about 20 V, and the concentration of the graphene oxide electroplating solution may be prepared for about 0.1 mg/ML to about 100 mg/ML. The thickness of the formed graphene oxide layer may be about 1 nm to about 200 nm. Specifically, the respective scope of the parameters, such as the electroplating time, the electroplating voltage, the concentration of the graphene oxide electroplating solution and the thickness of the resulted graphene oxide layer, etc., is independent from one another. The optimal value of each parameter should be determined according to the actual situation, and is not limited by the present disclosure.

In another embodiment, the electroplating time may be set for about 3 minute, the electroplating voltage may be set for about 5V, and the concentration of the graphene oxide solution may be prepared for about 2 mg/mL. In this situation, the thickness of the graphene oxide layer may be less than or equal to about 50 nm.

In another embodiment of the OLED manufacturing method according to the present disclosure, the electroplating time may be set for about 6 minute, the electroplating voltage may be set for about 5V, and the concentration of the graphene oxide solution may be prepared for about 2.5 mg/mL. The thickness of the resulted graphene oxide layer may be less than or equal to about 100 nm.

The graphene oxide material may be well dispersed in a blend of inorganic solvent and alcoholic organic solvent, compared with dispersed in an inorganic solvent. In one embodiment, the blend of the inorganic solvent and the alcoholic organic solvent may be used as a solvent for the graphene oxide material.

Before the electroplating process, a certain amount of the graphene oxide material is added to the blend of inorganic solvent and alcoholic organic solvent. After more than about 2 hours of ultrasound vibration, a stable graphene oxide electroplating solution can be obtained. The prepared graphene oxide electroplating solution is then added to the plating bath tank for the electroplating process.

According to one embodiment of the OLED manufacturing method of the present disclosure, the alcoholic organic solvent may include at least one of or any combination of: methanol, ethanol and isopropanol. The inorganic solvent may be deionized water. The selection of the alcoholic organic solvent and the inorganic solvent is not limited by the present disclosure.

The volume ratio of the inorganic solvent to the alcoholic organic solvent may be about 1:99 to about 1:1. And for the scope of the volume ratio of the inorganic solvent to the alcoholic organic solvent, an optimal value should be determined according to the actual situation and is not limited in the present disclosure.

Further, according to the OLED manufacturing method of the present disclosure, the graphene oxide electroplating solution may contain poly (3,4-ethylenedioxythiophene) and polystyrene sulfonate (PEDOT: PSS), which can increase the conductivity of the electroplating solution. Thus, the graphene oxide molecules can be more easily adsorbed on the surface of the anode layer in the electroplating process.

Furthermore, after S102 is executed to form the pattern of the graphene oxide layer over the pattern of the anode layer by the electroplating process, the manufacturing method may also include processing or treating the graphene oxide layer by oxygen plasma and/or ultraviolet (UV) radiation in ozone environment. After the oxygen plasma treatment or the UV radiation in ozone environment, the work function of the graphene oxide layer can be further increased, for example, for about 5 eV to about 5.2 eV, which further reduces the hole injection barrier and enhances the hole-injection and hole-transport capability of the OLED display device.

According to the present disclosure, the OLED manufacturing method can be implemented in a variety of embodiments. As an example, the present disclosure only provides three exemplary embodiments with each embodiment implemented in a different set of parameters.

First Exemplary Embodiment

First, a pattern of an anode layer is formed on a base substrate. The substrate on which the pattern of the anode layer is formed, along with a cathode are placed into a plating bath tank filled with about 2 mg/mL graphene oxide electroplating solution. A solvent of the graphene oxide electroplating solution is water and methanol. And the water to methanol volume ratio is about 1:2. About 5V voltage is applied between the anode and the cathode. After about 3 minutes of electroplating process, a pattern of the graphene oxide layer with a thickness of about 50 nm or less is formed on the pattern of the anode layer. Through the above process, an OLED display device is produced.

Second Exemplary Embodiment

At the beginning, a pattern of an anode layer is formed on a base substrate. The substrate on which the pattern of the anode layer is formed, along with a cathode are placed into a plating bath tank filled with about 2.5 mg/mL graphene oxide electroplating solution. A solvent of the graphene oxide electroplating solution is water and ethanol. And the water to ethanol volume ratio is about 1:1. About 5V voltage is applied between the anode and the cathode. After about 6 minutes of electroplating process, a pattern of the graphene oxide layer with a thickness no more than 100 nm is formed on the pattern of the anode layer. Through the above process, an OLED display device is produced.

Third Exemplary Embodiment

At the beginning, a pattern of an anode layer is formed on a base substrate. The substrate on which the pattern of the anode layer is formed, along with a cathode are placed into a plating bath tank filled with about 2 mg/mL graphene oxide electroplating solution. A solvent of the graphene oxide electroplating solution is water and ethanol. And the water to ethanol volume ratio is about 1:1. In addition, a small amount of poly(3,4-ethylenedioxythiophene) and polystyrene sulfonate (PEDOT:PSS) is added in the graphene oxide electroplating solution to increase the conductivity. About 5V voltage is applied between the anode and the cathode. After 3 minutes of the electroplating process, a pattern of the Graphene oxide layer with a thickness no more than 50 nm is formed on the pattern of the anode layer. Through the above process, an OLED display device is produced.

The above three exemplary embodiments describes the manufacturing method with the graphene oxide electroplating solution in different concentrations, different water to ethanol volume ratios, different electroplating voltages, different electroplating times and different thickness of the formed graphene oxide layer. In the electroplating process, the optimal value of each parameter may be determined according to the actual needs and is not limited by the present disclosure.

The present disclosure also provides an OLED display device produced by the disclosed manufacturing method. FIGS. 3a-3d illustrate respectively a schematic structure diagram of various exemplary OLED display devices.

Figure 3A:
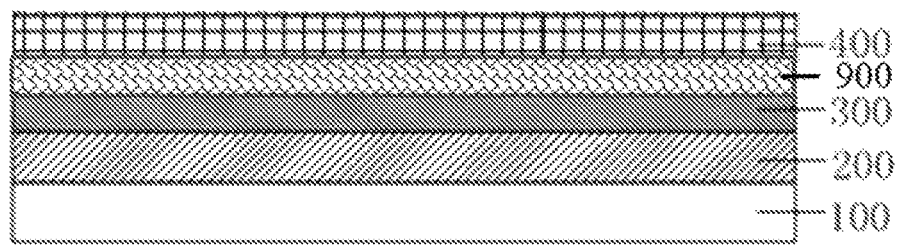
FIGS. 3a to 3d illustrate respectively schematic structure diagrams of exemplary OLED display devices according to various embodiments of the present disclosure.

As shown in FIG. 3a, the OLED display device includes a base substrate 100, a patterned anode layer 200 formed on the substrate 100 and a pattern of a graphene oxide layer 300 formed on the patterned anode layer 200. In this example, the graphene oxide layer 300 may be used as an auxiliary layer on the patterned anode layer 200, while a hole injection layer 900 may be formed on the graphene oxide layer 300, and a hole transport layer 400 may be formed on the hole injection layer 900.

In various embodiments, the graphene oxide layer 300 with its high work function, superior conductivity and high hole mobility can be used as a hole injection layer and/or a hole transport layer.

Figure 3B:
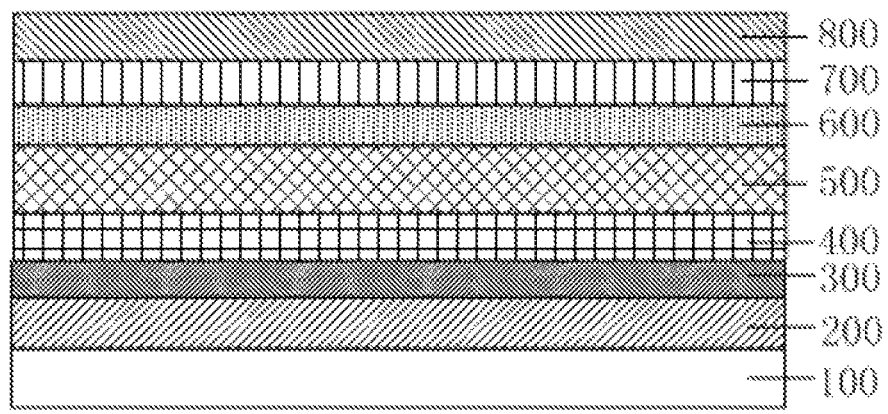

FIG. 3b illustrates a schematic structure diagram of the exemplary OLED display device with the graphene oxide layer 300 as the hole injection layer. As shown in FIG. 3b, the OLED display device may further include a hole transport layer 400, a light emitting layer 500, an electron transport layer 600, an electron injection layer 700 and a cathode layer 800 of the OLED display device, as shown in FIG. 3b.

The graphene oxide layer 300 is used as the hole injection layer formed on the patterned anode layer 200. The hole transport layer 400 is formed on the graphene oxide layer 300 used as the hole injection layer. The light emitting layer 500 is formed on the hole transport layer 400 in the OLED display device. The electron transport layer 600 is formed on the light emitting layer 500. The electron injection layer 700 is formed on the electron transport layer 600. The cathode layer 800 is formed on the electron injection layer 700.

Figure 3C:
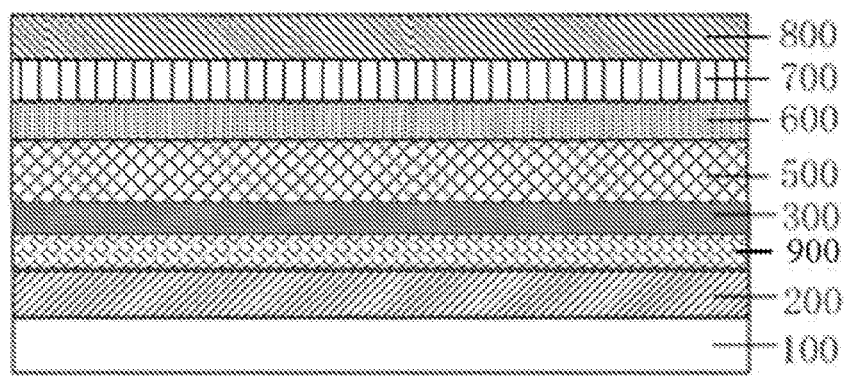

FIG. 3c illustrates a schematic structure diagram of the exemplary OLED display device with the graphene oxide layer 300 as the hole transport layer. As shown in FIG. 3c, the OLED display device may further include a light emitting layer 500, an electron transport layer 600, an electron injection layer 700 and a cathode layer 800 of the OLED display device.

As shown, a hole injection layer 900 is formed between the base substrate 100 having the patterned anode layer 200 and the graphene oxide layer 300 as the hole transport layer. The light emitting layer 500 is formed on the graphene oxide layer 300 as the hole transport layer in the OLED display device. The electron transport layer 600 is formed on the light emitting layer 500. The electron injection layer 700 is formed on the electron transport layer 600. The cathode layer 800 is formed on the electron injection layer 700.

Figure 3D:
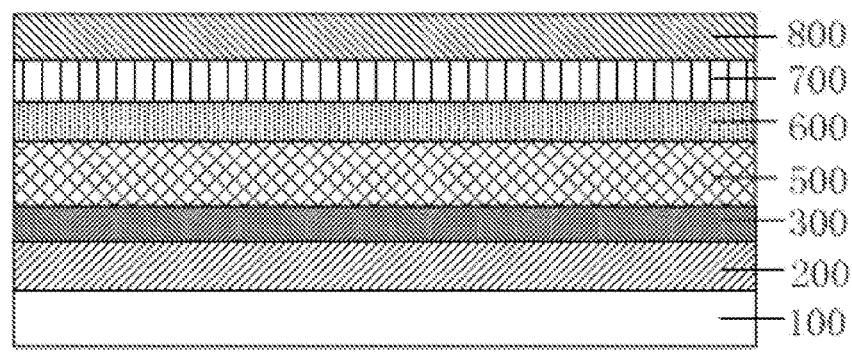

FIG. 3d illustrates a schematic structure diagram of the exemplary OLED display device with the graphene oxide layer 300 used as a hole injection layer and a hole transport layer. In this case, the hole injection layer 900 in FIG. 3c may be omitted and the graphene oxide layer 300 may be formed directly between the base substrate 100 having the patterned anode layer 200 and the light emitting layer 500 in the OLED display device. The electron transport layer 600 is formed on the light emitting layer 500. The electron injection layer 700 is formed on the electron transport layer 600. The cathode layer 800 is formed on the electron injection layer 700.

The OLED display device produced by the disclosed manufacturing method may further include an electron blocking layer, a hole blocking layer and other film layers as desired.

In one embodiment, the OLED display device may be a top emission light emitting display device or may be a bottom emission light emitting display device. In various embodiments, when the OLED display device includes the top emission structure, the material for the anode layer may be ITO/Ag/ITO, and the graphene oxide layer is formed on the anode (ITO/Ag/ITO) layer.

In various embodiments, when the OLED display device includes the bottom emission structure, the material of the anode layer may be ITO, and the graphene oxide layer is formed on the anode ITO layer. The OLED display device may have a variety of other structures without limitations.

Figure 4:
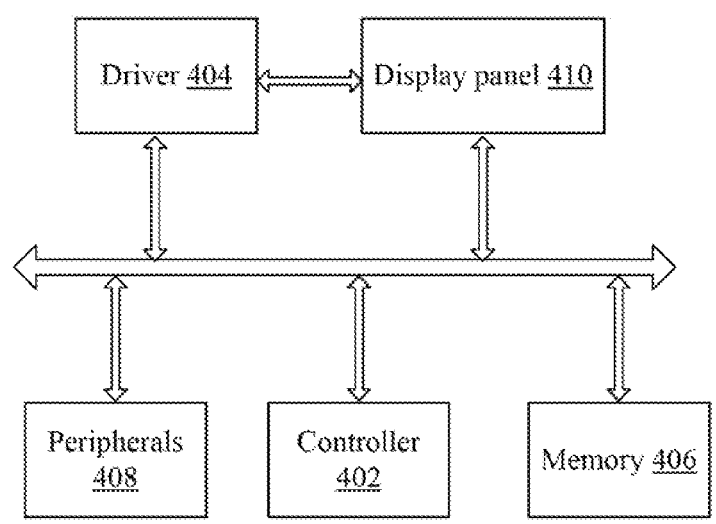
FIG. 4 illustrates a schematic block diagram of an exemplary display apparatus incorporating certain disclosed embodiments.

The present disclosure also provides a display apparatus. FIG. 4 illustrates an exemplary display apparatus incorporating certain disclosed embodiments. The display apparatus in FIG. 4 may be any appropriate device or component with certain display functions, such as a cell phone or smartphone, a tablet, a TV, a monitor, a laptop, a digital photo frame, or a navigation system, any products or components with display function, etc. As shown in FIG. 4, the display apparatus includes a controller 402, a driving circuit 404, memory 406, peripherals 408, and a display panel 410.

The controller 402 may include any appropriate processor or processors, such as a general-purpose microprocessor, digital signal processor, and/or graphic processor. Further, the controller 402 can include multiple cores for multi-thread or parallel processing. The memory 406 may include any appropriate memory modules, such as read-only memory (ROM), random access memory (RAM), flash memory modules, and erasable and rewritable memory, and other storage media such as CD-ROM, U-disk, and hard disk, etc. The memory 406 may store computer programs for implementing various processes, when executed by the controller 402.

Peripherals 408 may include any interface devices for providing various signal interfaces, such as USB, HDMI, VGA, DVI, etc. Further, peripherals 408 may include any input and output (I/O) devices, such as keyboard, mouse, and/or remote controller devices. Peripherals 408 may also include any appropriate communication module for establishing connections through wired or wireless communication networks.

The driving circuit 404 may include any appropriate driving circuits to drive the display panel 410. The display panel 410 may include any appropriate OLED display device. During operation, the display 410 may be provided with image signals or other source data signals by the controller 402 and the driving circuit 404 for display.

The present disclosure provides an OLED display device, a manufacturing method of the OLED display device and a display apparatus. The manufacturing method includes forming a pattern of an anode layer on a base substrate, forming a pattern of a graphene oxide layer on the pattern of the anode layer through an electroplating process. Since the graphene oxide film layer is prepared on the surface of the anode layer through the electroplating process, a high quality layer of graphene oxide layer is formed. Because of the high work function of the graphene oxide material, according to the disclosed OLED manufacturing method, the graphene oxide layer is introduced as a auxiliary layer by forming the pattern of the graphene oxide layer on the surface of the anode layer to reduce the hole injection barrier, which improves the hole injection and hole transport capability of the OLED display device, thereby improving the light emitting performance of the OLED display device.

The embodiments disclosed herein are exemplary only and not limiting the scope of this disclosure. Various alternations, modifications, or equivalents to the technical solutions of the disclosed embodiments can be obvious to those skilled in the art and can be included in this disclosure. Without departing from the spirit and scope of this disclosure, such other modifications, equivalents, or improvements to the disclosed embodiments are intended to be encompassed within the scope of the present disclosure.

What is claimed is:

1. A method of manufacturing an organic light-emitting diode (OLED) display device, comprising:
    forming a pattern of an anode layer directly on a base substrate;
    forming a hole injection layer directly on the anode layer;
    forming a hole transport layer over the hole injection layer;
    forming a light-emitting layer over the hole transport layer; and
    forming a graphene oxide layer directly on one of the hole injection layer and the hole transport layer as an auxiliary layer by an electroplating process.

2. The method according to claim 1, wherein forming the graphene oxide layer directly on one of the hole injection layer and the hole transport layer as the auxiliary layer by the electroplating process comprises:
    placing, after forming the hole injection layer, the base substrate and a cathode into a graphene oxide electroplating solution, and
    applying a voltage between the cathode and the hole injection layer to deposit the graphene oxide layer directly on the hole injection layer.

3. The method according to claim 2, further comprising:
    controlling a thickness of the graphene oxide layer during the electroplating process by controlling an electroplating time, an electroplating voltage, and a concentration of the graphene oxide electroplating solution.

4. The method according to claim 3, wherein controlling the thickness of the graphene oxide layer during the electroplating process includes:
    controlling the thickness of the graphene oxide layer to be about 1 nm to about 20 nm during the electroplating process by controlling the electroplating time to range from about 1 second to about 1000 seconds, the electroplating voltage to range from about 1 volt to about 20 volts, and the concentration of the graphene oxide electroplating solution to range from about 0.1 mg/mL to about 100 mg/mL.

5. The method according to claim 3, wherein controlling the thickness of the graphene oxide layer during the electroplating process includes:
    controlling the thickness of the graphene oxide layer to be about 50 nm or less during the electroplating process by controlling the electroplating time to be about 3 minutes, the electroplating voltage to be about 5 volts, and the concentration of the graphene oxide electroplating solution to be about 2 mg/mL.

6. The method according to claim 3, wherein controlling the thickness of the graphene oxide layer during the electroplating process includes:

controlling the thickness of the graphene oxide layer to be about 100 nm or less during the electroplating process by controlling the electroplating time to be about 6 minutes, the electroplating voltage to be about 5 volts, and the concentration of the graphene oxide electroplating solution to be about 2.5 mg/mL.

7. The method according to claim 2, wherein:

the graphene oxide electroplating solution includes a blend solvent including an inorganic solvent and an alcoholic organic solvent.

8. The method according to claim 7, wherein:

the alcoholic organic solvent includes a methanol, ethanol, isopropanol, or a combination thereof; and
the inorganic solvent includes deionized water.

9. The method according to claim 7, wherein:

the graphene oxide electroplating solution further contains poly (3,4-ethylenedioxythiophene) and polystyrene sulfonate (PEDOT:PSS).

10. The method according to claim 1, further comprising:

treating the graphene oxide layer by an oxygen plasma or an ultraviolet (UV) radiation in ozone environment.

11. An organic light-emitting diode (OLED) display device formed according to the method of claim 1.

12. A display apparatus, comprising the OLED display device according to claim 11.

13. The method according to claim 1, wherein forming the graphene oxide layer directly on one of the hole injection layer and the hole transport layer as the auxiliary layer by the electroplating process comprises:

placing, after forming the hole transport layer, the base substrate and a cathode into a graphene oxide electroplating solution, and
applying a voltage between the cathode and the hole transport layer to deposit the graphene oxide layer directly on the hole transport layer.

14. The method according to claim 13, further comprising:

controlling a thickness of the graphene oxide layer during the electroplating process by controlling an electroplating time, an electroplating voltage, and a concentration of the graphene oxide electroplating solution.

15. The method according to claim 14, wherein controlling the thickness of the graphene oxide layer during the electroplating process includes:

controlling the thickness of the graphene oxide layer to be about 1 nm to about 20 nm during the electroplating process by controlling the electroplating time to range from about 1 second to about 1000 seconds, the electroplating voltage to range from about 1 volt to about 20 volts, and the concentration of the graphene oxide electroplating solution to range from about 0.1 mg/mL to about 100 mg/mL.

16. The method according to claim 14, wherein controlling the thickness of the graphene oxide layer during the electroplating process includes:

controlling the thickness of the graphene oxide layer to be about 50 nm or less during the electroplating process by controlling the electroplating time to be about 3 minutes, the electroplating voltage to be about 5 volts, and the concentration of the graphene oxide electroplating solution to be about 2 mg/mL.

17. The method according to claim 14, wherein controlling the thickness of the graphene oxide layer during the electroplating process includes:

controlling the thickness of the graphene oxide layer to be about 100 nm or less during the electroplating process by controlling the electroplating time to be about 6 minutes, the electroplating voltage to be about 5 volts, and the concentration of the graphene oxide electroplating solution to be about 2.5 mg/mL.

18. The method according to claim 13, wherein:

the graphene oxide electroplating solution includes a blend solvent including an inorganic solvent and an alcoholic organic solvent.

19. The method according to claim 18, wherein:

the alcoholic organic solvent includes a methanol, ethanol, isopropanol, or a combination thereof; and
the inorganic solvent includes deionized water.

20. The method according to claim 18, wherein:

the graphene oxide electroplating solution further contains poly (3,4-ethylenedioxythiophene) and polystyrene sulfonate (PEDOT:PSS).

* * * * *